United States Patent [19]
Greschner et al.

[11] Patent Number: 6,004,700

[45] Date of Patent: Dec. 21, 1999

[54] MEMBRANE MASK FOR ELECTRON BEAM LITHOGRAPHY

[75] Inventors: Johann Greschner, Pliezhausen; Samuel Kalt, Reutlingen; Klaus Meissner, Herrenberg-Kayh; Rudolf Paul, Simmozheim, all of Germany

[73] Assignee: International Business Machines Corporation, Armonk, N.Y.

[21] Appl. No.: 09/040,099

[22] Filed: Mar. 17, 1998

[30] Foreign Application Priority Data

Mar. 17, 1997 [DE] Germany .................. 197 10 799

[51] Int. Cl.⁶ ....................................... G03F 9/00
[52] U.S. Cl. ................................. 430/5; 430/296
[58] Field of Search ....................... 430/5, 296

[56] References Cited

U.S. PATENT DOCUMENTS 4,751,169  6/1988  Behringer et al. ............. 430/296
5,567,551  10/1996  Yahalom et al. .................. 430/5

*Primary Examiner*—Christopher G. Young

[57] ABSTRACT

Membrane masks for electron-beam lithography are described which have a high mechanical stability and low membrane thickness, are free of stress and the submicron structures of which are easy to produce using reactive ion etching methods without rounding effects.

In the case of a membrane mask for structuring surface areas with the aid of electron or corpuscular beams, a layer 1 of silicon nitride with going right through openings, which define the mask pattern, is deposited on one surface of a semiconductor wafer 2, which consists preferably of silicon. A tub-shaped recess 3 extends from the other surface of the semiconductor wafer 2 as far as the layer-carrying surface.

A further mask for structuring surface areas with the aid of electron beams has at least one continuous layer 30 and a layer 31 defining the mask pattern.

These two layers are deposited on the surface of a semiconductor wafer 32 with a tub-shaped recess 33.

The anisotropic plasma etching method according to the invention makes it possible to transfer lithographically produced patterns to the membrane without the edge rounding which is otherwise usual.

11 Claims, 3 Drawing Sheets

MEMBRANE MASK FOR ELECTRON BEAM LITHOGRAPHY

TECHNICAL FIELD OF THE INVENTION

The invention relates to a manufacturing method for a membrane mask with mask fields, which are bounded by thin support walls. The membrane mask is suitable for exposure procedures using short-wave radiation.

BACKGROUND OF THE INVENTION

With the increasing diminution of the structures to be reproduced, electron-beam exposure procedures, which include X-ray beam, electron-beam and ion-beam procedures, are increasingly replacing optical lithography. They are used for manufacturing exposure masks or for the direct exposure of semiconductor wafers and in the case of the structure widths aspired to of only approx. 0.2 µm in the case of the 1 GBit chip generation they will be the dominant lithography processes.

While the mask substrates for conventional optical lithography consist of relatively thick (several mm) quartz plates, which are transparent for the normal light wavelengths, it has been attempted since as the beginning of the 1970s to use membrane masks for X-ray beam, electron-beam and ion-beam procedures. This permits an adequate throughput of semiconductor wafers at a higher resolution. The interactions of these three types of short-wave radiation with the mask call for membrane masks with a thickness of roughly 0.1 µm up to several µm.

The masks for ion-beams require holes in the membrane as a pattern, while for X-ray beam and electron-beam exposure closed membranes with metal-absorber patterns can also be used.

In all these cases the membrane mask is manufactured by an electron-beam pattern generator writing the appropriate patterns in photoresist. For structures smaller than 0.5 µm, the corner quality of the patterns written using electron beams is poor and the corners are rounded.

The pattern is then transferred to the membrane or the absorber layer by etching processes. The anisotropic plasma-etching processes mostly used are distinguished by exact pattern transfer, i.e. the corners which are already rounded in the photoresist are transferred to the membrane as rounded corners of almost identical dimensions.

Shadow masks, or hole masks, as shown in FIG. 4, in which the is pattern consists of physical holes and which are described for example in European patents EP 0 019 779 or EP 0 078 336, have been realized hitherto exclusively using a membrane 10 of silicon.

In the case of the shadow or stencil mask in EP 0 019 779, the n-doped silicon substrate has a p-doped surface layer, the membrane, which is coated with a thin chromium layer and two gold layers applied over it. This gold layer, which is typically several hundred nm (approx. 1 µm maximum) thick in total, was used to stop the electrons in the impermeable mask areas.

The membrane thicknesses are in the region of roughly 1 to 4 µm, typically 2 µm. Silicon membranes of this kind can be manufactured uniformly with the use of a doping etch stop of boron. As structure sizes become smaller and membrane thickness decreases, the demands on anisotropic plasma etching become ever greater and an extremely high p-doping is required as a doping etch stop, e.g. boron doping of approx. $1.3 \times 10^{20}$ boron atoms/cm$^3$. Silicon membranes with this degree of etch-stop doping display a high number of misalignment faults and mechanically are extremely fragile.

In masks with a closed oro continuous membrane for X-ray beam lithography, as shown in FIG. 5, the pattern is produced in the form of a structured metal absorber material 21 on the continuous membrane 20. in order for the membrane to be transparent to X-ray beams, it should be only a few pm thick and the membrane material should have an atomic number that is as small as possible, in order to absorb as little radiation as possible at the "transparent" areas.

The absorber material is also only a few pm thick and has as high an atomic number as possible. Typical metal absorbers consist of tungsten or gold and for membrane materials such as silicon, silicon nitride, silicon carbide, a silicide as proposed in EP 0 048 291 or recently also diamond have been selected.

The base for the membrane is a silicon wafer 22, which due to anisotropic etching has at least one opening going right through, the side walls of which consist of (111) planes and are inclined at 54.7° to the (100) surface of the silicon wafer.

With these masks, the problem of mask distortions caused by uneven mechanical stress in the membrane has not been solved satisfactorily to date. Mechanical distortions can be caused both by the membrane material itself and by the absorber material. In addition, the difficulty exists of structuring the metal absorber material by means of reactive ion etching in the submicron range.

A few years ago, an electron-beam projection process was proposed by S. D. Berger et al. In J.Vac.Sci.Technol. B9(6), November/December 1991, p. 2996–2999, "Projection electron-beam lithography: A new approach" which uses high-energy electrons and called for a new membrane mask technique. The SCALPEL™ mask (Scanning with Angular Limitation Projection Electron-Beam Lithography) also described by Huggins et al. in Proceedings of SPIE 1995, Vol. 2621, p. 247–255 and by J. A. Liddle et al. in Proceedings of SPIE 1994, Vol. 2322, p. 442–451 resembles the closed membrane masks used for X-ray beam lithography.

The layer thicknesses of the membrane and the metal absorber layer are smaller in the case of the SCALPEL masks. Electrons of approximately 100 keV penetrate both layers, but are scattered to a different extent in the different layers.

In contrast to the membrane masks used for X-ray beam lithography, the SCALPEL mask is divided into smaller mask fields. This division permits support walls, which provide a better mechanical and thermal stability. To keep the area loss between the mask fields to a minimum, the thin support walls are disposed perpendicular to the wafer surface and have been produced by anisotropic wet-etching from a (110) wafer.

Similarly to X-ray beam lithography masks, stress problems occur in the SCALPEL masks due to the membrane and/or the metal absorber layer. In the masks described inter alia in Proceedings of SPIE 1995, Vol. 2621, p. 247–255, the mask fields are long narrow strips, so that the unsupported membrane parts consist of rectangles of approximately 1 mm×2 cm in size. Since the membranes must be under tensile stress, different tensile stresses occur in the x-and y-direction, leading to an anisotropic distortion of the mask pattern.

U.S. Pat. No. 5,260,151 shows SCALPEL masks with square mask fields of approximately 1 mm edge length, in which the 0.1 mm thick and 1.0 mm high support walls delimiting the mask fields from one another are disposed perpendicular to the membrane of polycrystalline silicon. An isotropic stress distribution is thus achieved in the membrane. The manufacture of the thin, vertical support walls using anisotropic plasma etching techniques without damaging the membrane is admittedly problematic.

SUMMARY OF THE INVENTION

The invention relates to membrane masks for electron-beam lithography processes that have a high mechanical stability and freedom from stress with a low membrane thickness and are easy to manufacture using reactive ion etching methods.

A feature of the invention is the use of a very low temperature etching process for forming the mask pattern.

Another feature of the invention is the control of tensile stress in the layer(s) carrying the mask pattern.

DETAILED DESCRIPTION OF THE INVENTION

The use of silicon nitride as a membrane material instead of silicon highly doped with boron offers the advantage of being able to form the membrane with a smaller thickness and nevertheless of obtaining a mechanically more robust membrane. The reduced membrane thickness makes plasma etching considerably easier and the considerably greater etch selectivity of the nitride to the supporting semiconductor wafer of silicon makes the overall manufacturing process of the mask altogether more economical than is possible when using silicon membranes.

The formation of the continuous membrane layer as a layer combination of silicon dioxide/silicon nitride/silicon dioxide likewise offers satisfactory mechanical stability in the case of a minimum layer thickness.

The manufacturing method according to the invention makes it possible in the case of a silicon membrane to transfer lithographically produced patterns without the edge rounding which is otherwise common to the layer defining the mask pattern, the membrane.

Figure 1:
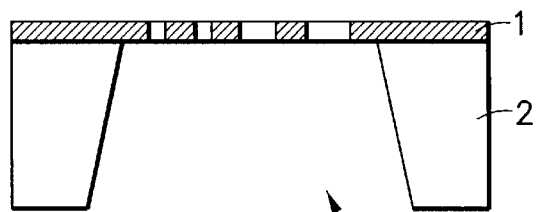
FIG. 1 shows the diagrammatic cross-section through a preferred form of performance of the invention

The diagrammatic cross-section shown in FIG. 1 shows a preferred form of performance of the invention. In the case of this membrane mask for patterning surface areas with the aid of electron or other particle beams, a layer 1 of silicon nitride is applied to a surface of a semiconductor wafer 2, which consists preferably of silicon. The silicon nitride layer has apertures going all the way through which define the mask pattern. Extending from the other surface of the semiconductor wafer 2 as far as the layer-carrying surface is a tub-shaped recess 3. The aperture walls formed by the remainder of layer 2 reinforce layer 1.

The silicon nitride layer 1 is approximately 0.1 $\mu$m to 2.0 $\mu$m thick and is preferably under a tensile stress of approximately $10^8$ dynes/cm$^2$. A silicon nitride membrane of this kind is mechanically stable and according to S. D.Berger et al. in J.Vac.Sci.Technol. B9(6), November/December 1991, p. 2996–2999, "Projection electron-beam lithography: A new approach" can withstand a pressure difference of one atmosphere at a thickness of just 0.1 $\mu$m over an area of several mm$^2$.

Figure 2A:
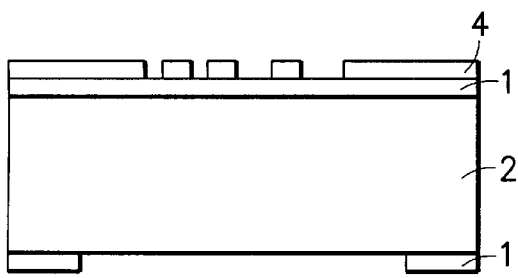
FIGS. 2a to 2d show the necessary process steps for the manufacture of the form of performance shown in FIG. 1

FIGS. 2a to 2d show the process steps required for manufacturing the mask in FIG. 1. In FIG. 2a, the subsequent membrane 1 is deposited on the front side of a semiconductor wafer 2 polished on both sides as LPCVD (low pressure chemical vapour deposition) silicon nitride $Si_3N_4$. The deposition parameters should be adjusted as known in the art to depend on the particular tool(s) being used to produce the desired stress in each layer.

The nitride layer 1 deposited at the same time on the back of the semiconductor wafer 2 can be used as a mask for the later wafer thinning step. On the nitride layer 1 on the front side a photoresist layer 4 is deposited, exposed with the mask pattern and developed.

Figure 2B:
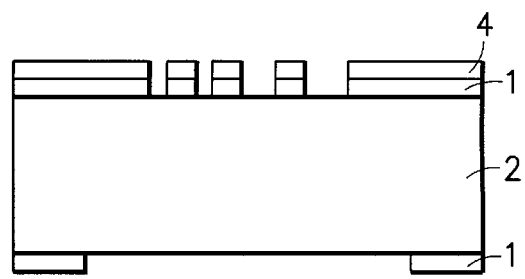

The mask pattern is transferred to the nitride layer 1 on the front side by means of an anisotropic (also referred to as a reactive ion) plasma etching step, as shown in FIG. 2b. An $SF_6/O_2$ gas mixture is used as the etch medium, the mix ratio of which is selected according to the manufacturer's instructions, depending on the geometry of the plasma etching tool such that the plasma etching produces windows with substantially vertical walls in the silicon nitride layer 1. in an illustrative embodiment, the plasma is generated by means of a helicon helix such as used in the MET tool from Alcatel and the gas is $SF_6/O_2$. Favourable temperatures for this etching process are in the range from approximately $-90°$ C. to approximately $-140°$ C., typically at $-130°$ C. In this temperature range, the anisotropy of the etch is considerably enhanced.

In the case of a silicon layer, these etching conditions facilitate etching that is partly dependent on the crystal orientation, by which term is meant that if the masking photo-resist layer has a curved corner the aperture in the silicon will initially follow the shape of the photoresist but, below a depth that will depend on various parameters the silicon will assume a rectangular shape. The side walls of the pattern etched are essentially influenced by the crystal orientation, but are not genuine crystal planes as in the case of anisotropic wet-etching.

This influence of crystal orientation in the present invention permits the etching of an extraordinarily deep (by integrated circuit standards) aperture of nominal depth 0.4 mm while still preserving the vertical sidewalls.

Figure 3:
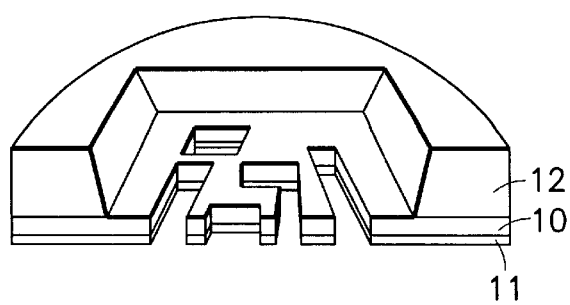
FIG. 3 is the representation of a hole mask known from the state of the art
Figure 4:
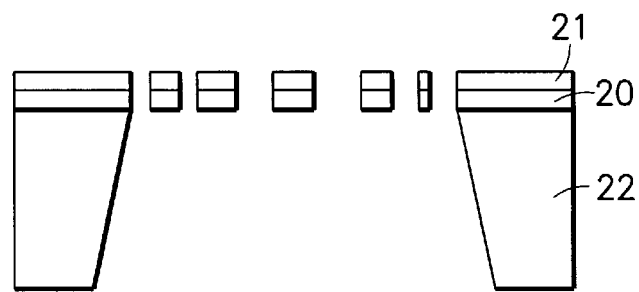
FIG. 4 is the representation of a mask known from the state of the art with a closed membrane for X-ray beam lithography
Figure 6:
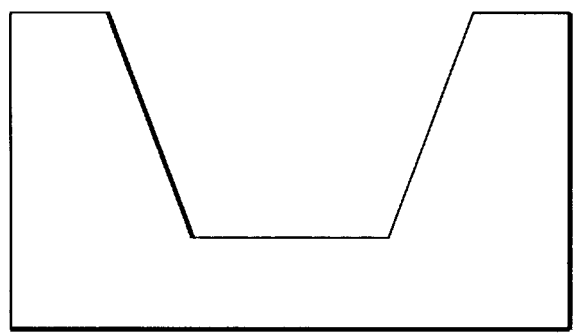
FIG. 6 shows the result of anisotropic wet-etch processes known from the state of the art

In the prior art, if a silicon wafer to be etched is oriented in the (110) direction, then the side walls are etched at an angle of 54.7° using conventional anisotropic wet-etching processes, e.g. with diluted KOH, and a V-shaped trough structure is produced as shown diagrammatically in FIG. 6 and FIG. 3. The presence of the sloping walls of the apertures takes up about as much area (for a 1 mm$^2$ and nominal 0.5 mm deep aperture) as the patterned area of the mask. This is evidently a considerable disadvantage.

Figure 7:
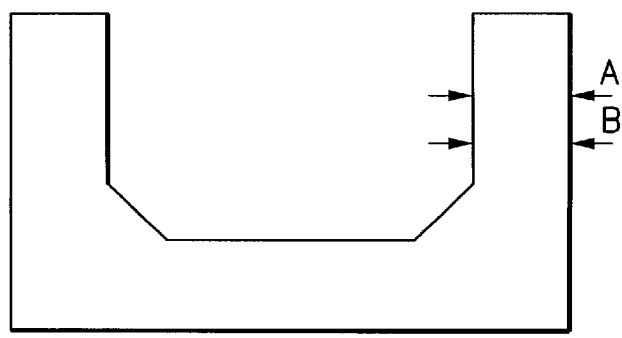
FIG. 7 shows the result of the plasma etching process according to the invention

If a wafer oriented in the (110) direction is etched partly in dependence on the crystal orientation using the illustrative embodiment above, then the trough structure shown diagrammatically in FIG. 7 is formed. If a circular pattern was defined by the photoresist layer, then the etched structure likewise still has a circular cross-section in the area of the cross-sectional plane at level A. In the area of the cross-sectional plane at level B by contrast, the etched structure has a square cross-section with vertical side walls.

Figure 8A:
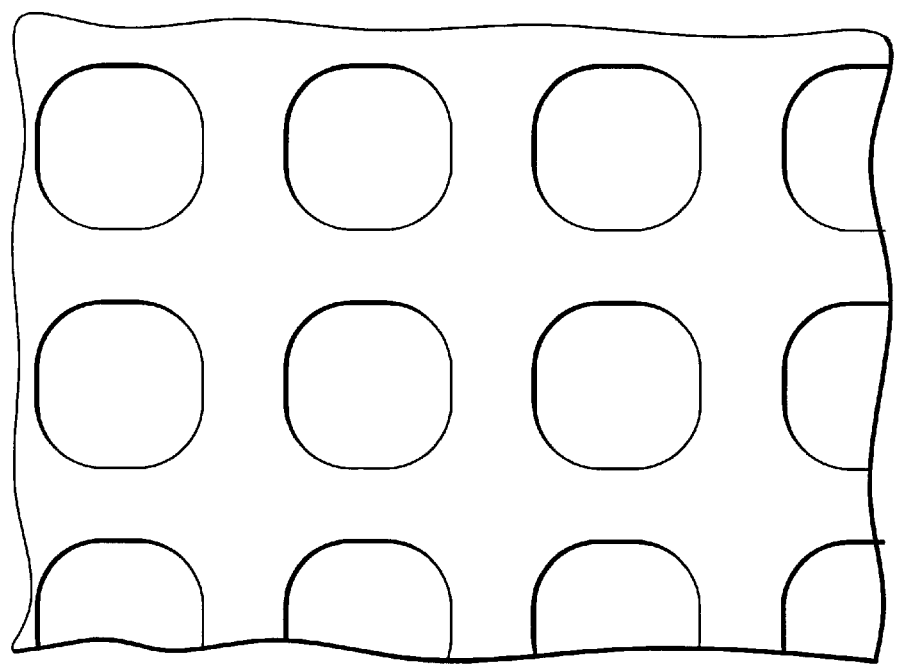
FIG. 8a shows the cross-section through the structure in FIG. 7 at level A
Figure 8B:
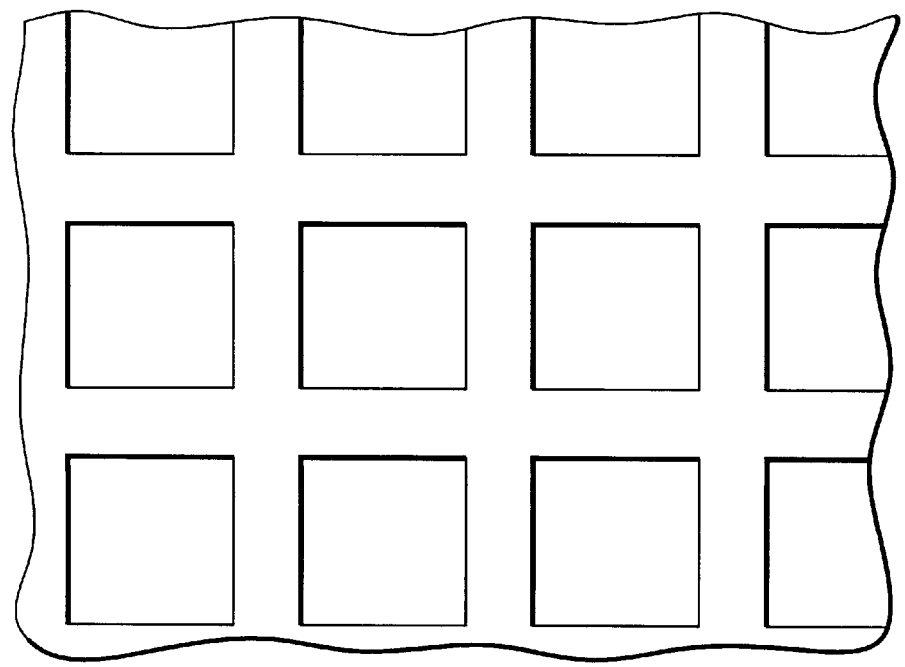
FIG. 8b shows the cross-section through the structure in FIG. 7 at level B

The electron-microscope print of a mask structure generated in this way can be seen in FIG. 8a and 8b. FIG. 8a shows the cross-section through the structure shown in FIG. 7 at level A with markedly rounded edges. In FIG. 8b, the cross-section through the structure shown in FIG. 7 at level B can be seen, after the layer has been removed as far as level B. This electron-microscope image shows the improvement in the quality of the lithographically produced pattern which is to be achieved with the inventive plasma etching method.

With this partly crystal-orientation-dependent etching it is possible to generate exact corner structures with vertical side walls in spite of corners which are already rounded in the structured photoresist. The pattern quality of membrane masks can thus be improved considerably.

Figure 2C:
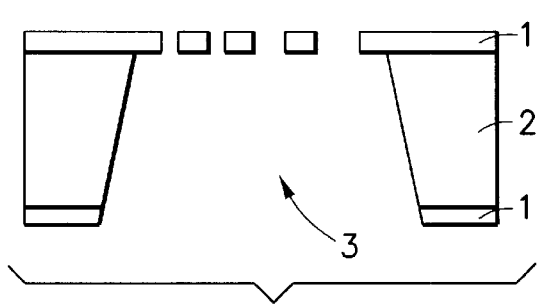

Following the plasma etching step, shown in FIG. 2b, the photoresist layer is removed and the semiconductor wafer is etched away in a KOH solution through the $Si_3N_4$ window on the reverse to form a tub-shaped recess 3, FIG. 2c. The etch selectivity of nitride to silicon is >1:1000 and thus the silicon nitride layer 1 already structured does not require any special protection during the wet-etching. Alternatively, the same low temperature plasma etch process described above can be used for the back side, thereby avoiding the sloping sides shown in FIG. 2c.

Figure 2D:
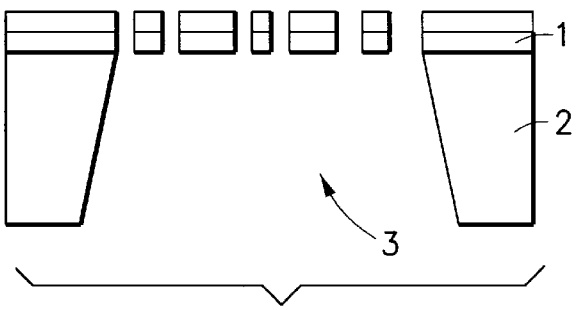

The membrane mask now produced can, as shown in FIG. 2d, contain one or more metal layers 5 deposited on the silicon nitride layer 1 depending on the intended use of the mask. Metals such as gold, platinum or tungsten in particular are suitable for this.

Figure 5:
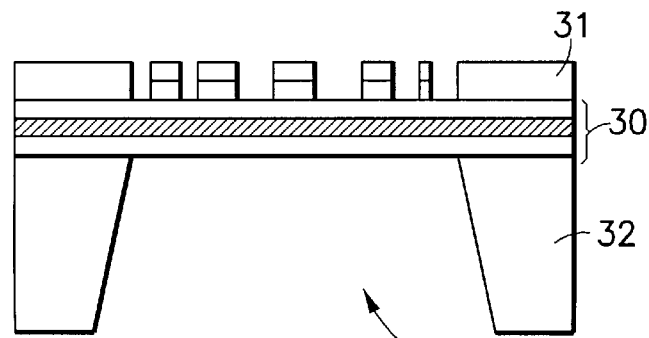
FIG. 5 shows the diagrammatic cross-section through a further preferred form of performance of the invention

In FIG. 5, a further preferred form of performance of the invention is shown in diagrammatic cross-section. The mask for patterning surface areas with the aid of electron beams has at least one continuous mask support layer 30 and a mask pattern layer 31 defining the mask pattern. These two layers are deposited on the surface of a semiconductor wafer 32, which has a tub-shaped recess 33, which extends from the bottom wafer surface into the semiconductor material 32 as far as the bottom of the mask support layer.

The continuous layer 30 is illustratively formed as a composite layer combination from a silicon dioxide layer 34, a silicon nitride layer 35 and a silicon dioxide layer 36. The layer thicknesses of the layers 34, 35, 36 forming the layer combination are coordinated to one another in such a way that the layer combination as a whole is under a low tensile stress, which is at roughly $10^8$ dynes/cm$^2$.

In the case of the O—N—O membrane, the two silicon dioxide layers 34, 36 preferably have compressive stress, while the layer 35 deposited as LPCVD nitride is under tensile stress. The dependence of stress at room temperature on the operating parameters of the tool is well known to vary from tool to tool.

Apart from the basic advantage of controlling the stress in the layer combination by means of the suitable choice of thickness, this layer sequence also possesses significant advantages during the mask manufacturing process.

Silicon dioxide provides an excellent etch stop both for the anisotropic wet etching of the reverse and for the anisotropic plasma etching of the front.

The thickness of the layer combination 30 should be as low as possible with adequate mechanical stability to guarantee minimum electron scatter and negligible absorption. The preferred thickness is in the range of approximately 0.1 μm to approximately 0.4 μm. The layer 31 defining the mask pattern should have a greater thickness, which is preferably around 2 μm.

To manufacture the mask, the layers silicon oxide/silicon nitride/silicon oxide-polysilicon are deposited one after another on a semiconductor wafer, preferably of silicon. The front side and reverse side of the wafer are then masked with silicon dioxide and photoresist. The tub-shaped recess is formed through the reverse-side window by means of KOH and the actual pattern is generated on the front by the anisotropic plasma etching step.

Single-crystal or polycrystalline silicon is particularly suitable as mask pattern layer material. The stress inside the layer 31 can be adjusted by suitable doping of the silicon. In this case the manufacturing process is rather more costly, but can be sensible due to the better stress control in the case of single-crystal silicon. Starting materials in this case are two differently coated semiconductor wafers of silicon. One wafer is coated with the layer combination of silicon oxide-silicon nitride-silicon oxide and the second blank wafer is joined to the first by anodic bonding. The second wafer is then polished down to the residual thickness desired for the layer 31. The further process steps are the same as those described above.

Those skilled in the art will appreciate that variations can be made to the examples illustrated. For example, a wet etch is not essential. An anisotropic plasma etch would save space by eliminating the sloping sides of the aperture walls.

While the invention has been described in terms of illustrative embodiments, those skilled in the art will recognize that the invention can be practiced in various versions within the spirit and scope of the following claims.

We claim:

1. A mask for impressing a pattern on an electron beam, comprising a semiconductor wafer, at least one continuous mask support layer deposited on a first surface of said semiconductor wafer, and a pattern layer deposited on said continuous layer, said pattern layer having apertures therethrough that define a mask pattern;

said semiconductor wafer further having a set of recesses extending from a lower surface of said semiconductor wafer opposite said first surface into said semiconductor wafer as far as said first surface, in which;

said continuous layer is a composite layer combination of a first sublayer of silicon dioxide, a second sublayer of silicon nitride, and a third sublayer of silicon dioxide, said sublayers having sublayer stresses related to one another so that said composite layer has a net tensile stress.

2. A mask according to claim 1, characterized in that the net tensile stress is approximately $10^8$ dynes/cm$^2$.

3. Mask according to claim 1, characterized in that the composite layer has a thickness in the range between about 0.1 μm to about 0.4 μm.

4. Mask according to claims 3, characterized in that the pattern layer defining the mask pattern has a thickness of approximately 2.0 μm.

5. Mask according to claim 2, characterized in that the net tensile stress is approximately $10^8$ dynes/cm$^2$.

6. Mask according to claim 2, characterized in that the composite layer has a thickness in the range between about 0.1 μm to about 0.4 μm.

7. Mask according to claim 5, characterized in that the pattern layer defining the mask pattern has a thickness of approximately 2.0 μm.

8. A mask according to claim 1, in which said pattern layer comprises silicon.

9. A mask according to claim 1, in which said pattern layer comprises single crystal silicon.

10. A mask according to claim 4, in which said pattern layer comprises silicon.

11. A mask according to claim 4, in which said pattern layer comprises single crystal silicon.

* * * * *